United States Patent
Tago (10) Patent No.: US 9,743,507 B2
(45) Date of Patent: Aug. 22, 2017

(54) RADIO FREQUENCY MODULE

(71) Applicant: Murata Manufacturing Co., Ltd., Nagaokakyo-shi, Kyoto-fu (JP)

(72) Inventor: Shigeru Tago, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/698,983

(22) Filed: Apr. 29, 2015

(65) Prior Publication Data

US 2015/0237712 A1    Aug. 20, 2015

Related U.S. Application Data

(63) Continuation of application No. PCT/JP2013/073894, filed on Sep. 5, 2013.

(30) Foreign Application Priority Data

Nov. 29, 2012  (JP) .................................. 2012-261764

(51) Int. Cl.
*H05K 1/11* (2006.01)
*H05K 1/02* (2006.01)
*H05K 1/18* (2006.01)

(52) U.S. Cl.
CPC .............. *H05K 1/0218* (2013.01); *H05K 1/11* (2013.01); *H05K 1/183* (2013.01)

(58) Field of Classification Search
CPC ................................ H05K 1/0218; H05K 1/11
USPC ................. 361/761, 764, 782–784, 790–795
See application file for complete search history.

(56) References Cited

U.S. PATENT DOCUMENTS

| 2008/0117609 | A1 | 5/2008 | Itou et al. |
| 2009/0188703 | A1* | 7/2009 | Ito ................... H01L 23/49838 174/255 |
| 2014/0138822 | A1* | 5/2014 | Williamson ...... H01L 23/49827 257/738 |

FOREIGN PATENT DOCUMENTS

| JP | 2008-130612 A | 6/2008 |
| JP | 2008-270479 A | 11/2008 |
| JP | 2009-071094 A | 4/2009 |
| JP | 2011-003584 A | 1/2011 |
| JP | 2011003584 A * | 1/2011 |
| JP | 2012-190923 A | 10/2012 |
| JP | 2012-195468 A | 10/2012 |

(Continued)

OTHER PUBLICATIONS

Official Communication issued in International Patent Application No. PCT/JP2013/073894, mailed on Oct. 8, 2013.

(Continued)

*Primary Examiner* — Courtney Smith
*Assistant Examiner* — Jessey R Ervin
(74) *Attorney, Agent, or Firm* — Keating & Bennett, LLP (57) ABSTRACT

A radio frequency module includes a plurality of insulating base material layers made of a thermoplastic resin defining a multilayer circuit board and including a cavity inside thereof, an IC chip disposed in the cavity and including a noise generation source, and planar ground conductive bodies provided in the multilayer circuit board. The planar ground conductive bodies are disposed on a layer not exposed to the inner surface of the cavity, and include inter-layer connection conductive bodies protruding in the direction of the noise generation source from the planar ground conductive bodies.

11 Claims, 9 Drawing Sheets

(56) References Cited

FOREIGN PATENT DOCUMENTS

JP          2012190923  A   *  10/2012

OTHER PUBLICATIONS

Official Communication issued in corresponding Japanese Patent Application No. 2014-521768, mailed on Jul. 22, 2014.
Tago, "Radio Frequency Module", U.S. Appl. No. 15/600,829, filed May 22, 2017.

* cited by examiner

FIG. 7
COMPARATIVE
EXAMPLE

RADIO FREQUENCY MODULE

BACKGROUND OF THE INVENTION

1. Field of the Invention

The present invention relates to a radio frequency module configured in a multilayer circuit board whose base material is a resin having flowability during heating and pressurizing, such as a thermoplastic resin, and more particularly, the present invention relates to a radio frequency module including a component that may be a noise generation source provided inside of the radio frequency module.

2. Description of the Related Art

How to implement components on a circuit board in an electronic device with a high density in order to reduce the size of the electronic device has always been a technical problem. Modularizing components to be mounted on a circuit board is effective to increase the density. In many cases, such module components are of the types that include chip components in a multilayer circuit board.

As described above, when a module component including a chip component such as an IC in a multilayer circuit board is made, e.g., a radio frequency module including an IC having an oscillation circuit is provided, there is a problem in that a peripheral circuit is affected by a radio frequency noise generated by the oscillation circuit. For example, JP 2012-190923 A indicates that a ground conductive body pattern is disposed in proximity to an IC chip in order to suppress the effect of such radio frequency noise.

The use of a thermoplastic resin for a base material layer of a multilayer circuit board is attracting attention in recent years. With this multilayer circuit board, a Cu foil is attached to the surface of the thermoplastic resin base material, and a circuit pattern is formed by etching this Cu foil, and a plurality of base material layers are laminated and thermocompression-bonded, so that the multilayer circuit board is formed. When a component is included inside of this multilayer circuit board, the resin around the component flows during the thermocompression-bonding, and accordingly the component is fixed. As described above, the thermoplastic resin can form the multiplayer circuit board using an easy process.

However, when a multilayer circuit board which includes an IC chip including an oscillation circuit therein is made according to the above production method using a thermoplastic resin for the base material layer, the following problem may occur when a ground conductive body pattern for suppressing noise emission from around the oscillation circuit is disposed in proximity. More specifically, the periphery of the IC chip is a cavity formed in advance, and for this reason, even though it is necessary to flow a large amount of resin into the cavity, the ground conductive body pattern blocks the resin from spreading. As a result, a gap is generated because the resin insufficiently spreads into the cavity, and this may cause failure to fix the IC chip.

Figure 9A:
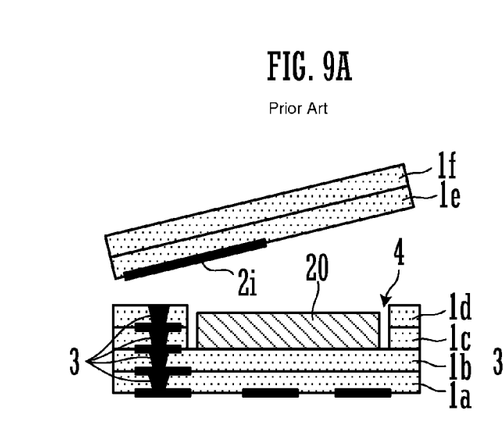
FIGS. 9A to 9C are cross sectional views illustrating a structure of a conventional radio frequency module.
Figure 9B:
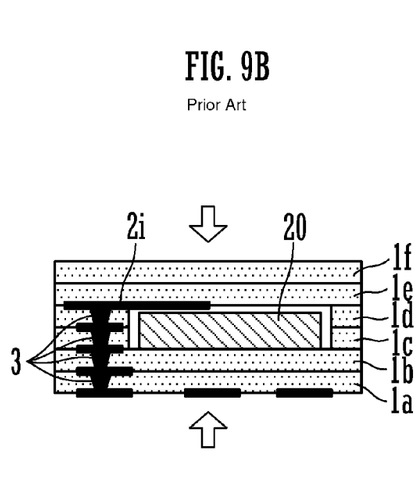
Figure 9C:
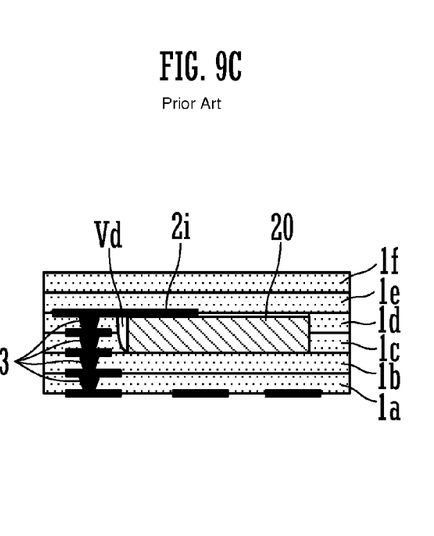

FIGS. 9A to 9C are views illustrating an example of such a process. As shown in FIG. 9A, a cavity 4 is formed by a stacked body including base material layers 1c, 1d having an opening formed therein and base material layers 1a, 1b without any opening formed therein, and an IC chip 20 is provided in the cavity 4, and thereafter, as shown in FIG. 9B, a stacked body made of base material layers 1e, 1f is placed thereon. Subsequently, as shown in FIG. 9C, heating and pressurizing are performed. At this occasion, the ground conductive body pattern 2i blocks the resin from spreading, and a gap Vd remains (the gap Vd is formed).

SUMMARY OF THE INVENTION

Preferred embodiments of the present invention provide a radio frequency module which is configured to prevent or suppress generation of a gap around a component in a case where the component including a noise generation source is disposed in a cavity of a multilayer circuit board including a base material layer of a thermoplastic resin.

A radio frequency module according to a preferred embodiment of the present invention includes a stack of a plurality of insulating base material layers defining a multilayer circuit board and including a cavity inside thereof; a component disposed in the cavity and including a noise generation source; and a ground conductive body provided in the multilayer circuit board, wherein the insulating base material layer is a layer made of a thermoplastic resin having flowability during heating and pressurizing, the ground conductive body is disposed on a layer not exposed to an inner surface of the cavity, and the radio frequency module includes an inter-layer connection conductive body electrically connected to the ground conductive body but not electrically connected to a conductive body portion provided in the component and disposed at a position opposite to a local portion of the component, the inter-layer connection conductive body protruding in a direction of the cavity from the ground conductive body.

According to this configuration, the ground conductive body pattern does not exist in immediate proximity to the cavity, and therefore, when the multilayer circuit board is produced, a gap is less likely to be generated between the cavity and the component, and the component is reliably fixed to the cavity.

The ground conductive body is preferably a planar ground conductive body extending in a planar manner in a layer direction of the insulating base material layers. According to this configuration, a noise shielding effect achieved by the ground conductive body is enhanced.

The planar ground conductive body preferably includes at least two planar ground conductive bodies sandwiching the cavity (noise generation source) in a layer direction, and the inter-layer connection conductive bodies are preferably protruding in a direction of the cavity from the two planar ground conductive bodies. According to this configuration, the emission of the noise generated from the component in the cavity is more effectively reduced or prevented.

The local portion of the component is located at a position of a noise generation source in the component. According to this configuration, the emission of the noise from the noise generation source is more effectively reduced or prevented.

The noise generation source is, for example, an oscillation circuit.

The inter-layer connection conductive body preferably includes a thickened portion extending toward the cavity from the ground conductive body. Accordingly, it is easy to ensure the size of the opposing area of the conductive body (inter-layer connection conductive body) facing the noise generation source at the close proximity position to face, and the effect of suppressing the noise emission is significantly improved.

According to various preferred embodiments of the present invention, even in a case where a component including a noise generation source is disposed in a cavity of a multilayer circuit board including a base material layer made of a resin having flowability during heating and pressurizing, generation of a gap around the component is prevented while the noise reduction effect is significantly improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a view illustrating a structure of a radio frequency module 101 according to a first preferred embodiment of the present invention, and more specifically, FIG. 1 is a cross sectional view where the radio frequency module 101 is mounted on a circuit board 30.

DETAILED DESCRIPTION OF THE PREFERRED EMBODIMENTS

First Preferred Embodiment

Figure 1:
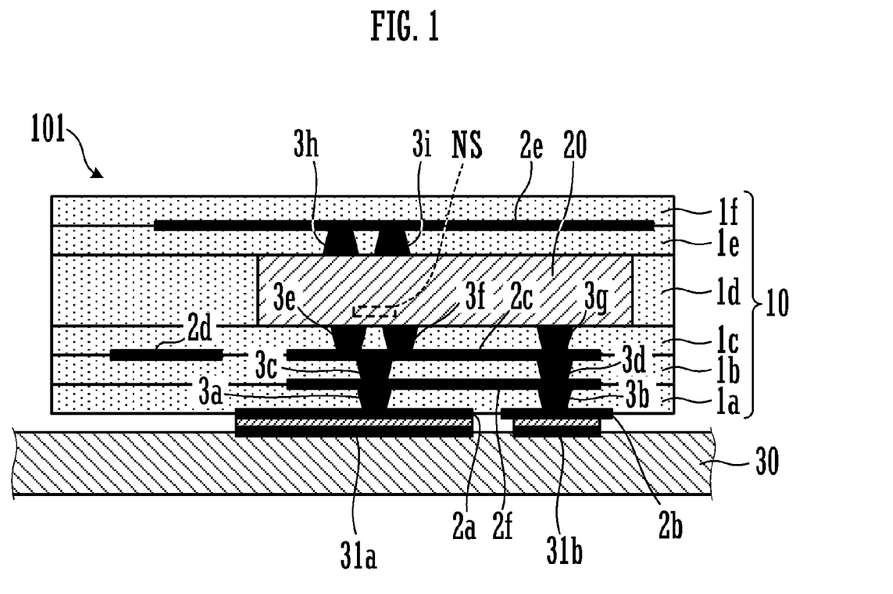

FIG. 1 is a view illustrating a structure of a radio frequency module 101 according to a first preferred embodiment of the present invention, and more specifically, FIG. 1 is a cross sectional view where the radio frequency module 101 is mounted on a circuit board 30. This radio frequency module 101 is provided in a multilayer circuit board 10 preferably formed by stacking insulating base material layers $1a$ to $1f$. A cavity is provided in this multilayer circuit board 10, and an IC chip 20 is disposed (buried) in the cavity. As shown below, this IC chip is a component including a noise generation source. Planar ground conductive bodies $2c$, $2e$, $2f$ extending in a planar manner are provided in the multilayer circuit board 10. The multilayer circuit board 10 includes other conductive body patterns $2a$, $2b$, $2d$. In addition, inter-layer connection conductive bodies (via conductive bodies) $3a$, $3b$, $3c$, $3d$, $3e$, $3f$, $3g$, $3h$, $3i$, and the like are provided.

Each of the insulating base material layers $1a$ to $1f$ is a layer made of a thermoplastic resin. The planar ground conductive bodies $2c$, $2e$ are disposed at positions (layers) not exposed to the inner surface of the cavity. In addition, inter-layer connection conductive bodies $3e$, $3f$, $3h$, $3i$ protruding in a direction of the cavity (IC chip) from the planar ground conductive bodies $2c$, $2e$ are provided.

The IC chip 20 includes a noise generation source NS configured therein. This noise generation source NS is, for example, an oscillation circuit. The inter-layer connection conductive bodies $3e$, $3f$, $3h$, $3i$ are protruding from the planar ground conductive bodies $2c$, $2e$ so as to come into proximity to the noise generation source NS in particular.

Chip components are surface-mounted on the upper surface of the multilayer circuit board 10, but the chip components are not shown in FIG. 1.

When the radio frequency module 101 is surface-mounted on the circuit board 30, mounting terminals $2a$, $2b$ of the radio frequency module 101 are connected to mounting electrodes $31a$, $31b$.

Figure 2:
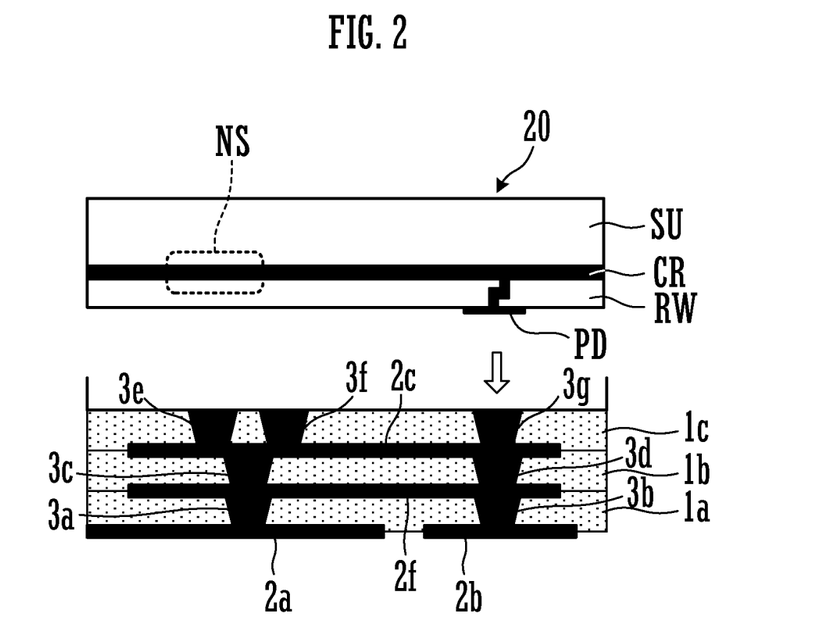
FIG. 2 is an exploded cross sectional view illustrating a relationship between an IC chip 20 and a surface of a cavity in a multilayer circuit board.

FIG. 2 is an exploded cross sectional view illustrating a relationship between the IC chip 20 and a surface of the cavity in the multilayer circuit board. A predetermined radio frequency circuit is provided on a circuit formation layer CR of a surface of a substrate SU of the IC chip 20 (at the side of the lower surface in the direction of FIG. 2). A rewiring layer RW is provided on a surface of this circuit formation layer CR, and an electrode pad PD is exposed on the surface of this rewiring layer RW. This is electrically connected to the inter-layer connection conductive body $3g$ exposed on the inner surface of the cavity of the multilayer circuit board. The inter-layer connection conductive bodies $3e$, $3f$ are not electrically connected to any electrode pad of the IC chip 20, and are configured to simply come into proximity to the noise generation source NS.

Figure 3:
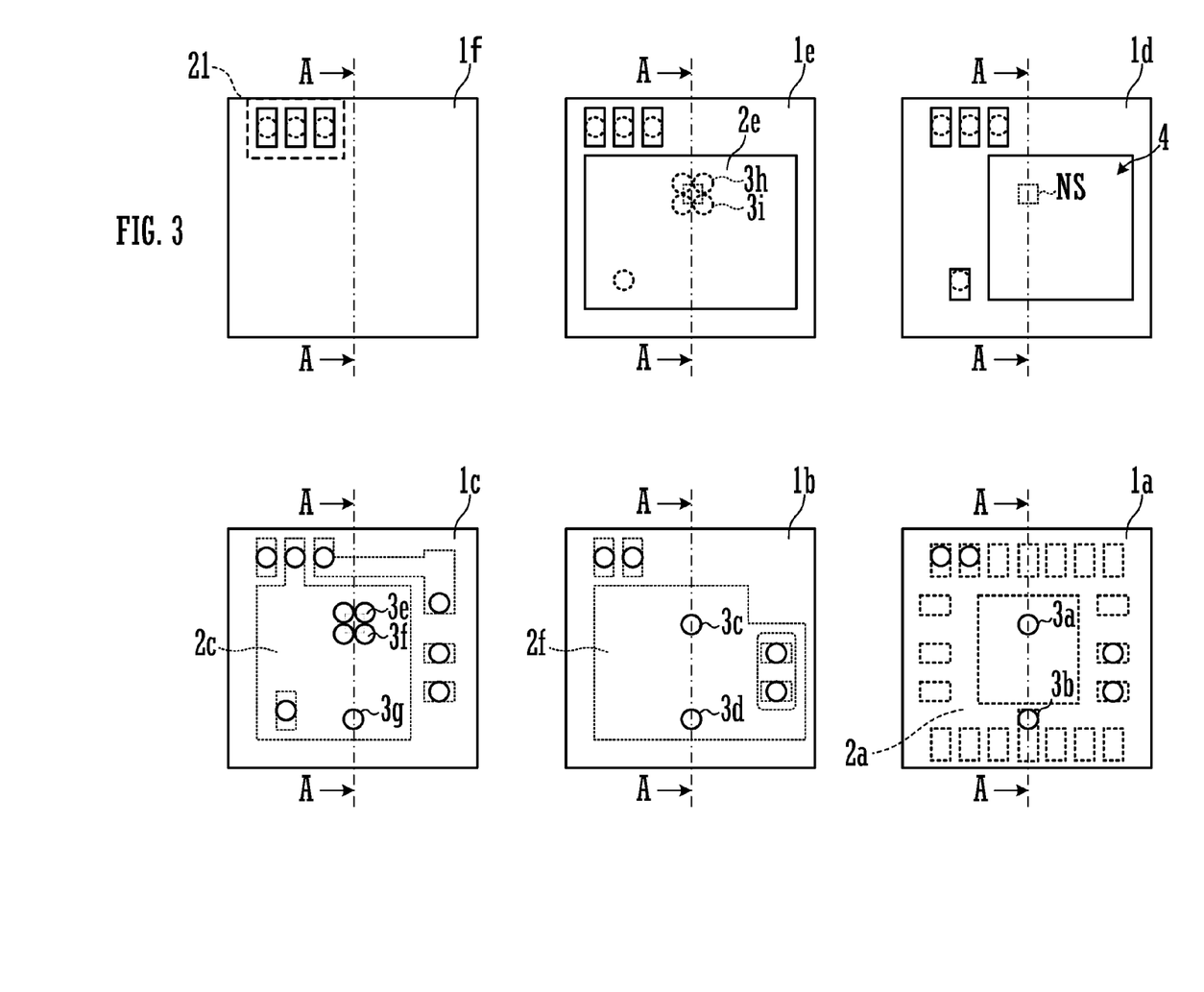
FIG. 3 is a view illustrating a conductive body pattern provided on each layer constituting the multilayer circuit board.

FIG. 3 is a view illustrating a conductive body pattern formed on each layer constituting the multilayer circuit board. Any of these drawings is an upper surface view of an insulating base material layer (hereinafter simply referred to as a "base material layer"). FIG. 1 is a cross section taken along line A-A of FIG. 3.

The base material layer $1f$ is an uppermost layer, and electrodes to mount a radio frequency filter 21 are provided on this base material layer $1f$. The planar ground conductive body $2e$ is provided on the upper surface of the base material layer $1e$, and the inter-layer connection conductive bodies $3h$, $3i$, and the like are provided in the inside of the base material layer $1e$. In the base material layer $1d$, a cavity 4 (opening) is provided. The planar ground conductive body $2c$ is provided on the lower surface of the base material layer $1c$, and the inter-layer connection conductive bodies $3e$, $3f$, $3g$ and the like are provided in the inside of the base material layer $1c$. The planar ground conductive body $2f$ is provided on the lower surface of the base material layer $1b$, and the inter-layer connection conductive bodies $3c$, $3d$, and the like are provided in the inside of the base material layer $1b$. A plurality of mounting terminals are provided on the lower surface of the base material layer $1a$, and the inter-layer connection conductive bodies $3a$, $3b$, and the like are provided in the inside of the base material layer $1a$.

Figure 4A:
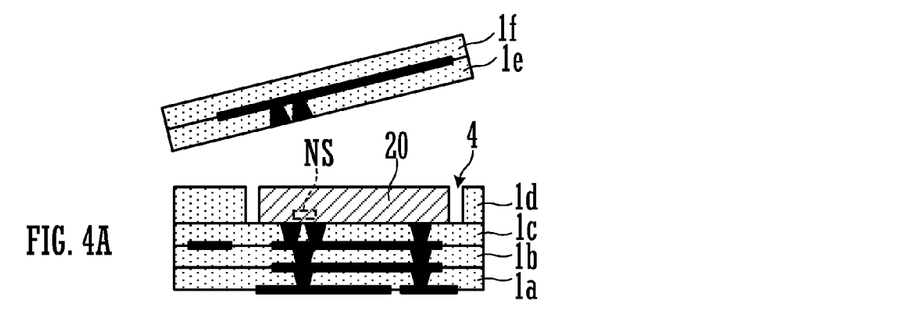
FIGS. 4A to 4D are views illustrating production steps of the radio frequency module 101.
Figure 4B:
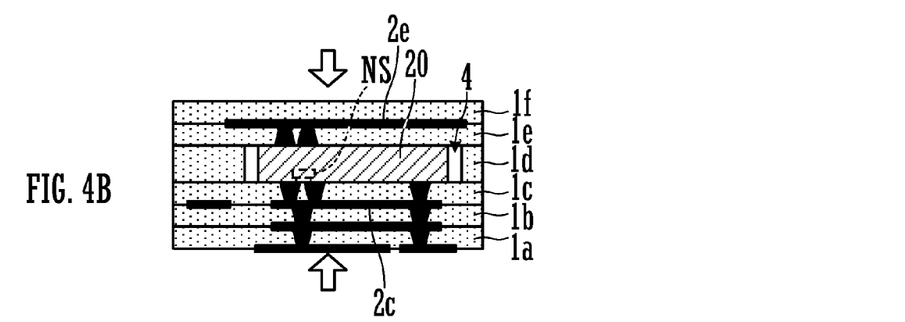
Figure 4C:
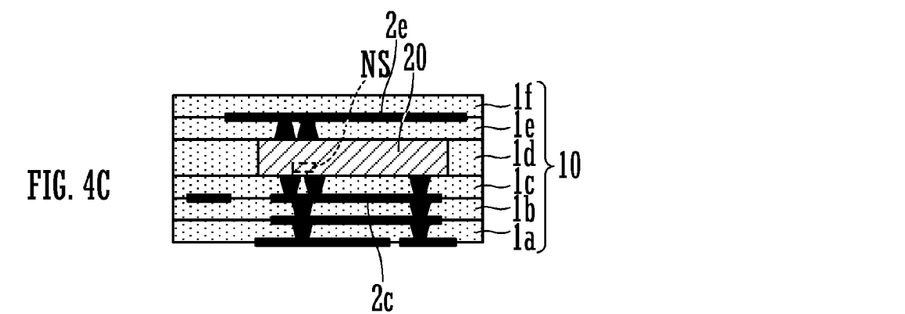
Figure 4D:
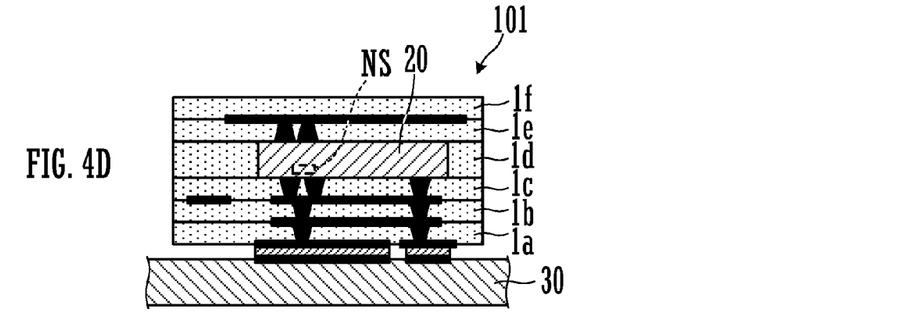

FIGS. 4A to 4D are views illustrating production steps of the radio frequency module. In FIGS. 4A to 4D, FIGS. 4A to 4C are cross sectional views of the steps, and FIG. 4D is a cross sectional view when the radio frequency module is mounted on the circuit board.

A wiring pattern provided on a resin layer preferably is formed by, e.g., removing a copper foil attached to a resin sheet by etching. The inter-layer connection conductive body preferably is formed by forming a via hole in a resin sheet, injecting a conductive paste into the formed via hole, and heating and solidifying when collectively stacked. More specifically, this inter-layer connection conductive body ensures electric conductivity between copper foils of resin sheets.

As shown in FIG. 4A, the cavity 4 is defined by a stacked body including the base material layer 1*d* including the opening provided therein and the base material layers 1*a*, 1*b*, 1*c* without any opening provided therein, and the IC chip 20 is disposed in the cavity 4, and thereafter, as shown in FIG. 4B, the stacked body including the base material layers 1*e*, 1*f* is placed thereon. Subsequently, heating and pressurizing is applied as shown in FIG. 4C. At this occasion, the planar ground conductive bodies 2*c*, 2*e* do not block the resin from spreading. Therefore, a gap hardly remains (a gap is hardly formed).

The radio frequency module 101 is configured as described above. This radio frequency module 101 is mounted on the surface of the circuit board as shown in FIG. 4D.

Figure 5:
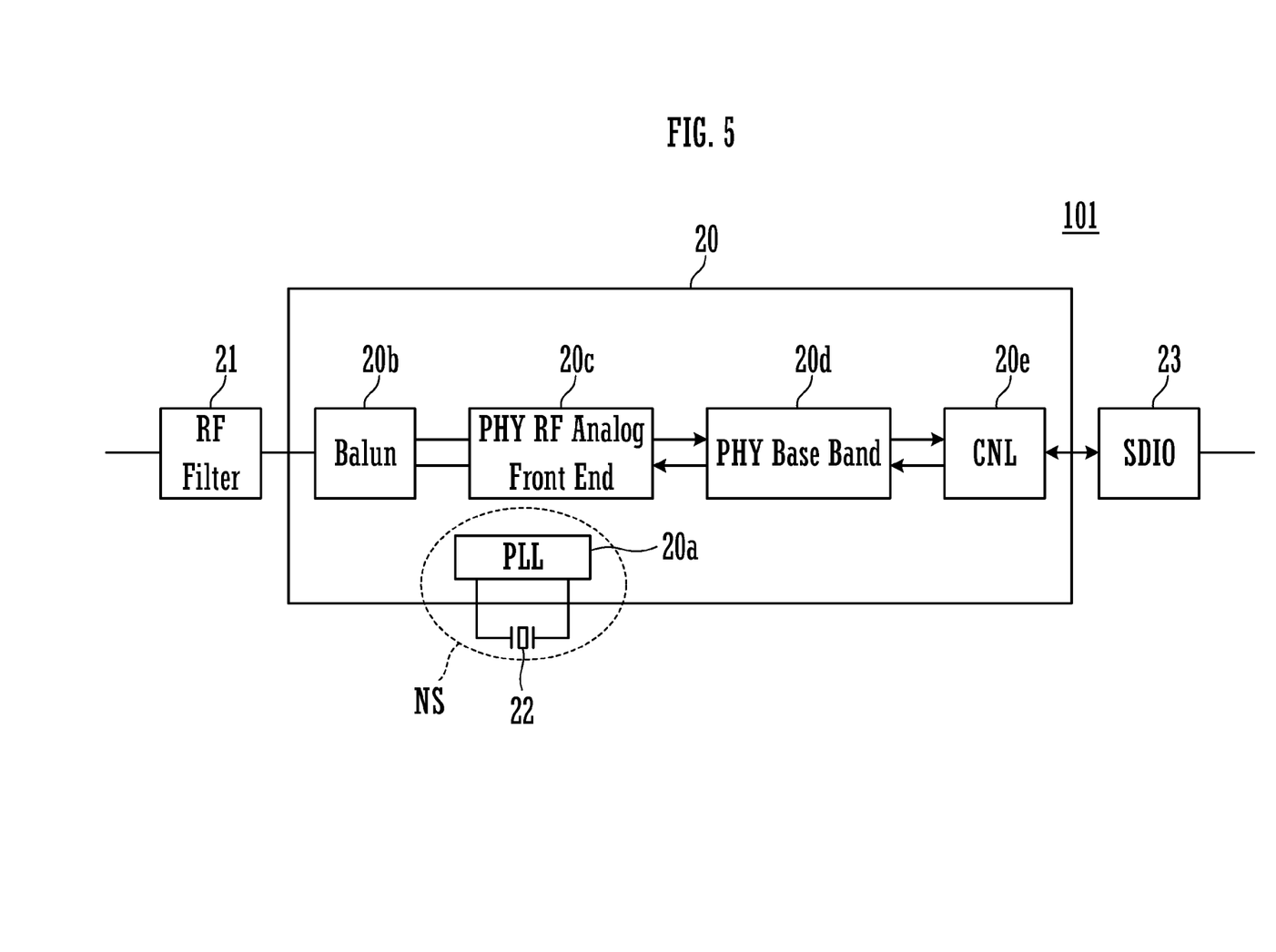
FIG. 5 is a block diagram illustrating a circuit provided in the radio frequency module 101.

FIG. 5 is a block diagram illustrating a circuit provided in the radio frequency module 101. The radio frequency module 101 includes the IC chip 20, the radio frequency filter 21, and a serial data input output controller 23. The IC chip 20 includes a balanced-to-unbalanced transformation circuit 20*b*, an analog front end circuit 20*c*, a base band circuit 20*d*, a control circuit 20*e*, and an oscillation circuit 20*a*. In this case, the analog front end circuit 20*c* is a radio frequency circuit of a physical layer of a communication protocol, and the base band circuit 20*d* is a base band circuit of a physical layer of a communication protocol.

The oscillation circuit 20*a* is connected to a crystal oscillator 22 mounted on the multilayer circuit board to oscillate and generate a clock signal and a radio frequency signal of a predetermined frequency with a PLL circuit. This oscillation circuit 20*a* corresponds to the noise generation source NS. The noise generation source NS is not limited to an oscillation circuit. Alternatively, the noise generation source NS is may be a frequency divider circuit and the like.

Second Preferred Embodiment

Figure 6:
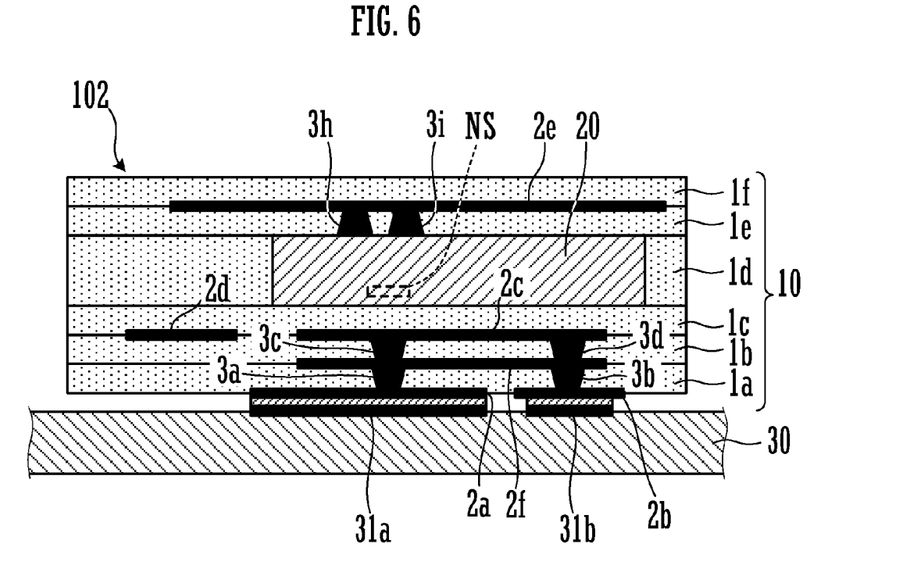
FIG. 6 is a cross sectional view illustrating a structure of a radio frequency module 102 according to a second preferred embodiment of the present invention.

FIG. 6 is a cross sectional view illustrating a structure of a radio frequency module 102 according to a second preferred embodiment of the present invention. Unlike the example as shown in FIG. 1, inter-layer connection conductive bodies protruding in a direction of an IC chip 20 from a planar ground conductive body 2*c* (3*e*, 3*f* as shown in FIG. 1) are not provided.

Even with such a structure, the planar ground conductive bodies 2*c*, 2*e* are provided on layers not exposed to the cavity (a space where the IC chip 20 is buried), and therefore, the planar ground conductive bodies 2*c*, 2*e* do not block the resin from spreading.

Figure 7:
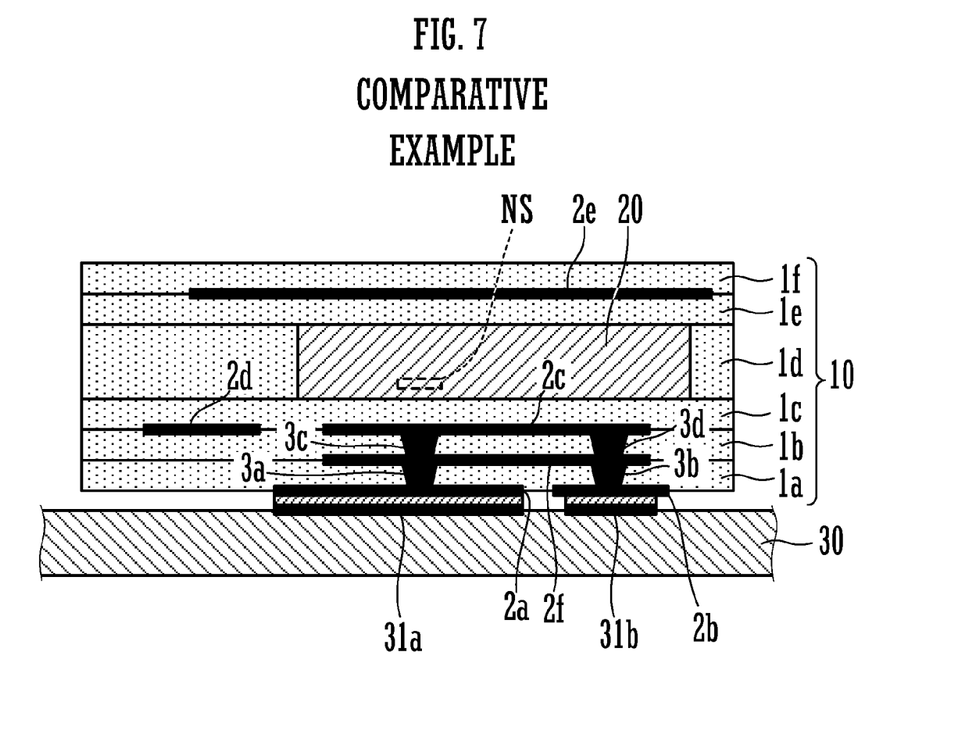
FIG. 7 is a cross sectional view illustrating a structure of a radio frequency module according to a comparative example.

Here, an example of noise reduction effect of the radio frequency module 102 according to this preferred embodiment will be shown. The structure of the radio frequency module according to the comparative example is as shown in FIG. 7. The radio frequency module according to the comparative example does not have inter-layer connection conductive bodies protruding in a direction of the IC chip 20 from the planar ground conductive bodies 2*c*, 2*e* (3*e*, 3*f*, 3*h*, 3*i* as shown in FIG. 1).

In this case, measurement is performed according to the so-called "3m method" on the basis of the specification of license-free weak radio stations that defines a permissible value of an electric field strength at a position three meters away from the radio station.

When the electric field strength of an emission noise was measured at a position 3 meters away from the radio frequency module, the electric field strength thereof emitted by the radio frequency module according to the comparative example was 34 dBµV/m, and the electric field strength thereof emitted by radio frequency module 101 according to the first preferred embodiment was 26 dBµV/m. This indicates that the emission noise was reduced by about 8 dBµV/m, for example.

As described above, the inter-layer connection conductive bodies 3*h*, 3*i* are provided only at the side of the IC chip 20 away from the circuit formation layer where the noise generation source NS (oscillation circuit) is provided, but the effect of suppressing the emission noise is achieved even with this configuration.

Likewise, measurement is also performed for a radio frequency module having such a structure that includes the inter-layer connection conductive bodies 3*e*, 3*f* protruding in the direction of the IC chip 20 from the planar ground conductive body 2*c* as shown in FIG. 1 but does not include the inter-layer connection conductive bodies 3*h*, 3*i* protruding in the direction of the IC chip 20 from the planar ground conductive body 2*e*.

With the radio frequency module having this structure, the electric field strength of the emission noise is reduced by about 10 dBµV/m, for example. Therefore, this indicates that the electric field strength of the emission noise is reduced by about 20 dBµV/m, for example, with the radio frequency module having the structure as shown in FIG. 1 in the first preferred embodiment.

Third Preferred Embodiment

Figure 8:
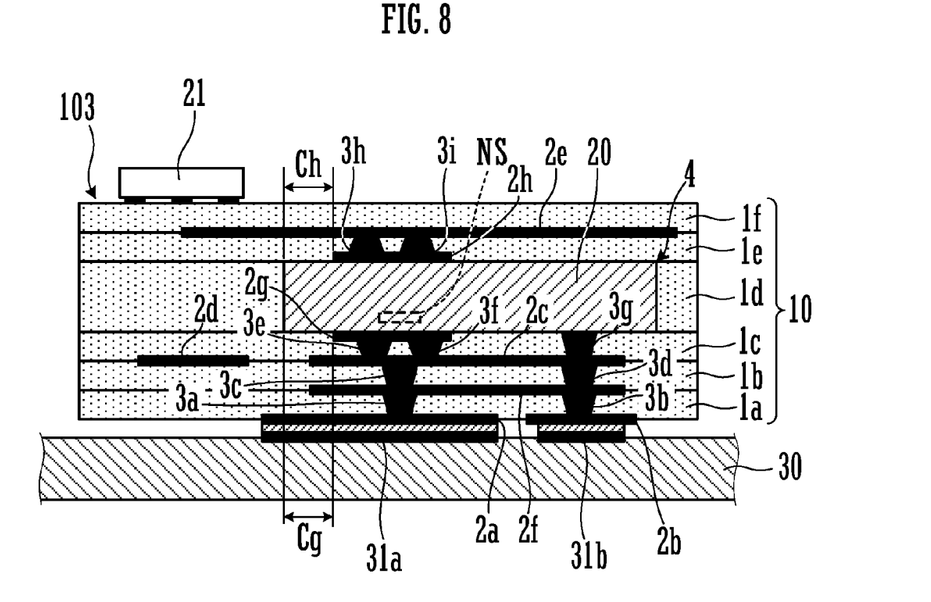
FIG. 8 is a cross sectional view illustrating a structure of a radio frequency module 103 according to a third preferred embodiment of the present invention.

FIG. 8 is a cross sectional view illustrating a structure of a radio frequency module 103 according to a third preferred embodiment of the present invention. Unlike the example as shown in FIG. 1, the conductive body patterns 2*g*, 2*h* exposed to the inner surface of the cavity 4 are provided, and the inter-layer connection conductive bodies 3*e*, 3*f* are electrically connected to the conductive body pattern 2*g*, and the inter-layer connection conductive bodies 3*h*, 3*i* are electrically connected to the conductive body pattern 2*h*. When this structure is compared with the structure in which only the inter-layer connection conductive bodies are protruding, the size of conductive body patterns that come into proximity with the noise generation source NS is large in this structure, and therefore, the effect of suppressing the emission noise is higher in this structure.

In the example as shown in FIG. 8, the conductive body patterns 2*g*, 2*h* have clearances of sizes Cg, Ch from the end edge of the cavity 4. Therefore, the flowability of the resin into the cavity 4 during heating and pressurizing is not blocked.

It should be noted that in the example as shown in FIG. 8, the radio frequency filter 21 is surface-mounted on the upper surface of the multilayer circuit board 10. This chip 21 is a radio frequency filter as shown in FIG. 5, and passes and blocks a signal in a desired frequency band. The serial data input output controller 23 as shown in FIG. 5 is further implemented on the multilayer circuit board.

In each of the preferred embodiments of the present invention described above, a through via is shown as a non-limiting example of inter-layer connection conductive body. Alternatively, a hole not penetrating the base material layer may be formed, and a filling of conductive paste may be configured to protrude in a direction of the cavity (noise generation source direction).

In each of the preferred embodiments of the present invention described above, for example, the ground conductive body disposed on a layer not exposed to the inner surface of the cavity is a planar ground conductive body extending in a planar manner in the layer direction of the insulating base material layer. Alternatively, preferred embodiments of the present invention can also be applied to a ground conductive body in a line shape of such a thickness as to block a resin from spreading to a cavity.

In each of the preferred embodiments of the present invention described above, for example, the inter-layer connection conductive body preferably is formed by forming a via hole in a resin sheet, injecting a conductive paste into the formed via hole, and heating and solidifying when collectively stacked, for example. Alternatively, the inter-layer connection conductive body may have a structure using a metal rivet, a structure made by forming a through hole and plating the inner surface thereof, and the like. Still alternatively, the inter-layer connection conductive body may have a structure for making inter-layer connection using a conductive bump buried in an insulating layer in advance. For example, a conical protrusion (bump) may be formed by printing a silver paste on a copper foil.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio frequency module comprising:
    a stack of a plurality of insulating base material layers defining a multilayer circuit board including a cavity inside thereof;
    a component disposed in the cavity and including a noise generation source; and
    a ground conductive body having a planar or linear shape and disposed inside the multilayer circuit board; wherein
    the insulating base material layer is a layer made of a thermoplastic resin having flowability during heating and pressurizing;
    the ground conductive body is disposed on a layer not exposed to an inner surface of the cavity;
    the radio frequency module includes an inter-layer connection conductive body electrically connected to the ground conductive body but not electrically connected to a conductive body portion provided in the component and disposed at a position opposite to a local portion of the component, the inter-layer connection conductive body protruding in a direction of the cavity from the ground conductive body, and all portions of the inter-layer connection conductive body being covered by the component in a planar view in a stacking direction of the multilayer circuit board; and
    no conductive body having a planar or linear shape, being connected to the inter-layer connection conductive body, and being nearer to the component than the inter-layer connection conductive body is provided.

2. The radio frequency module according to claim 1, wherein the ground conductive body is a planar ground conductive body extending in a planar manner in a layer direction of the insulating base material layers.

3. The radio frequency module according to claim 2, wherein
    the planar ground conductive body includes at least two planar ground conductive bodies sandwiching the cavity in the layer direction;
    the inter-layer connection conductive body includes at least two inter-layer connection conductive bodies; and
    the inter-layer connection conductive bodies protrude in a direction of the cavity from the two planar ground conductive bodies.

4. The radio frequency module according to claim 1, wherein the local portion of the component is located at a position of the noise generation source in the component.

5. The radio frequency module according to claim 1, wherein the noise generation source is an oscillation circuit.

6. The radio frequency module according to claim 1, wherein a thickness of the inter-layer connection conductive body increases from the ground conductive body towards the cavity.

7. The radio frequency module according to claim 1, wherein the component is an IC chip.

8. The radio frequency module according to claim 1, wherein the inter-layer connection conductive body is a conductive via hole.

9. The radio frequency module according to claim 1, wherein the ground conductive body includes first and second ground conductive bodies, the inter-layer connection conductive body protrudes in a direction of the component from the first ground conductive body, and no inter-layer connection conductive body protrudes in a direction of the component from the second ground conductive body.

10. The radio frequency module according to claim 1, wherein the inter-layer connection conductive body includes a hole extending only partially through the base material layers and including a conductive paste in the hole.

11. The radio frequency module according to claim 1, wherein the inter-layer connection conductive body is one of a plated through hole, a metal rivet, and a conductive bump.

* * * * *